MAGNETIC DOMAIN IMPRESSED COATED WIRE ATTENUATOR
WITH WIDE DYNAMIC RANGE
Filed July 18, 1966

INVENTOR.
CHARLES P. WOMACK
BY
Moody and Kintzinger
ATTORNEYS

United States Patent Office 3,403,350
Patented Sept. 24, 1968

3,403,350
MAGNETIC DOMAIN IMPRESSED COATED WIRE ATTENUATOR WITH WIDE DYNAMIC RANGE

Charles P. Womack, Marion, Iowa, assignor to Collins Radio Company, Cedar Rapids, Iowa, a corporation of Iowa Filed July 18, 1966, Ser. No. 565,835
7 Claims. (Cl. 330—144)

ABSTRACT OF THE DISCLOSURE

A magnetic domain impressed thin film ferromagnetic attenuator with the thin film deposited as a closed circutious band on a wire also used as one signal inductive means and with a second wire as a winding, or substantially the straight wire equivalent thereof, so placed in immediate close contact or substantially so and oriented substantially at right angles to the axis of the other wire as to be a second signal inductive means in proper operational alignment with the rest direction of a magnetization vector $\overline{M}$ impressed in the thin film band.

Figure 1:
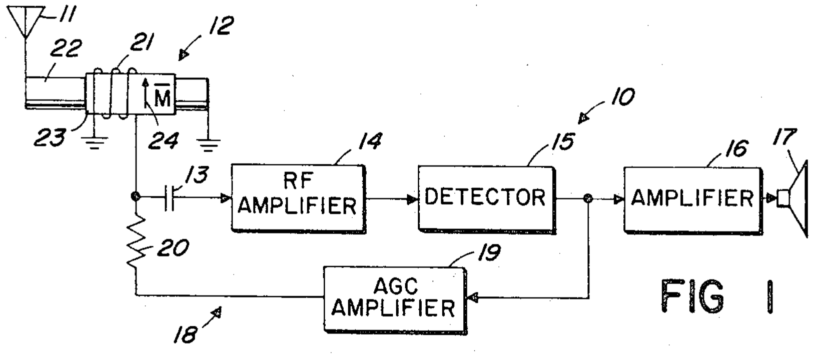

This invention relates in general to amplifier gain control, and in particular, to an automatic gain control system with variation in AGC voltage applied to a thin film device for controlling the degree of attenuation of signals imparted to and passed through the device through a wide dynamic range of operation.

Whenever it becomes necessary to construct an amplifier with triode tubes or transistors having sharp cutoff characteristics, problems of excessive distortion and cross modulation are likely to arise, and particularly so if an effort is made to obtain a wide dynamic range of input signal levels with many existing AGC control systems. Many of these AGC systems supply variable voltage to some element of an amplifying device in order to alter the forward signal transfer characteristics of the device. The variable voltage is usually taken from the output of the amplifier so that its magnitude is some measure of the input signal level. However, application of such control voltage to a sharp cutoff device causes non-linear operation and severely limits the magnitude of input signals that may be handled without excessive distortion.

A good step forward as a result of considerable effort that has gone into devising wide dynamic range amplifying systems is represented by U.S. Patent No. 3,259,846, issued July 5, 1966, entitled "AGC Voltage Controlled Thin Film RF Attenuator" to William S. Elliott and Harlan G. Michael, assignors to the common assignee of applicant's invention. The referenced patent is a significant advance in the state of the art as an attenuator utilizing the single domain behavior of planar thin magnetic films; that is, films vapor deposited in the presence of an external orienting magnetic field upon a suitable planar substrate as glass, thereby creating in the process an easy or preferential rest direction of the magnetization vector $\overline{M}$. It utilizes two orthogonal windings, one aligned with the rest direction, and the other at substantially right angles thereto, with one winding serving as a single input winding and the other winding acting as a signal output winding. The output winding serves the dual function of being both a signal output winding and an AGC signal attenuation control winding with both the input and output windings wound around the substrate. An RF signal applied to the input winding will, for proper values of control bias, be coupled to the output winding with an attenuation effect control particularly suitable for the attainment of wide dynamic range with an amplifier. There are, however, inherent problem areas varying in degree with planar thin magnetic film signal transmitting attenuation control devices.

Such planar structures have an open magnetic flux path that must be adequately shielded to prevent undesired signal coupling with adjacent circuits. When such planar thin magnetic film structures are produced, they must be deposited in a vacuum necessitating the use of complex and expensive equipment, such as vacuum chambers or stations of various types. Further, these planar thin magnetic films possess relatively large demagnetization fields with the attendant required reduction of such fields requiring precise control of film thicknesses during deposition, a factor adding considerably to production costs. In utilization of planar thin magnetic films, the open flux paths encountered present alignment problems between the two windings of an attenuator and particularly in the attainment of an appropriate alignment relation to the easy or rest direction of the magnetization vector, since the alignment procedure must be practiced while any shielding employed is in place. Another factor is that with the two orthogonal windings some unbalance exists with the inherent skew of the turns a factor making a null condition, practically speaking, impossible to attain. Furthermore, there is a problem of eddy currents with such planar thin film structures that are capable of coupling input signals to the output.

It is, therefore, a principal object of this invention to provide an automatic gain control system for an amplifier with an AGC voltage controlled attenuating device having particularly good linear operation characteristics throughout a wide dynamic range and with distortion products normally present with many AGC control methods and signal attenuating systems substantially eliminated.

Another object is to provide an AGC control attenuating device utilizing a closed magnetic flux path as opposed to an open magnetic flux path and to thereby eliminate or at least minimize any shielding required in preventing undesired coupling to adjacent circuits.

A further object is to provide such an AGC voltage controlled attenuating device with alignment of the inductive input and the inductive output respect to the easy or rest direction of the magnetization vector a simple task that may be accomplished without any requirement for shielding being in place during alignment procedures.

A feature of this invention, useful in accomplishing the above objects, is the use of an RF attenuator utilizing the single domain behavior of very thin ferromagnetic films for producing a variable attenuation in accordance with the magnitude of variable control voltage or AGC current. The AGC voltage controlled device utilizes an element offering many advantages in such AGC signal amplifier input attenuation control. The element particularly useful for such AGC attenuation control is a thin magnetic film electroplated about a round wire in the presence of an orienting magnetic field so imposed as to establish an easy or preferential rest direction of the magnetization vector $\overline{M}$ in a circumferential direction in the thin magnetic film about the round wire. It is interesting to note that the magnetic flux path is closed thereby resulting in a negligible demagnetization field. Furthermore, the equivalent of one of the windings, either input or output, of the attenuation device is the plated wire itself having an inherent magnetic field alignment with the easy direction of circumferential magnetization in the thin film, a factor eliminating one of the variable characteristics encountered with planar film devices as employed in an attenuating circuit. In addition, the other winding, or substantially the straight wire equivalent thereof, is so positioned and/or so wound about the thin film deposition on the coated wire as to thereby inherently provide proper alignment with respect to the rest direction of the magnetization vector $\overline{M}$. This, obviously, presents an AGC voltage controlled signal attenuation device requiring no particular alignment procedures and with which, generally, substantially no, if any, shielding is needed.

Figure 2:
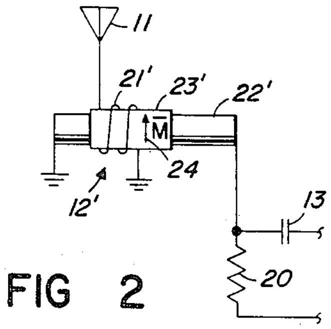
Figure 3:
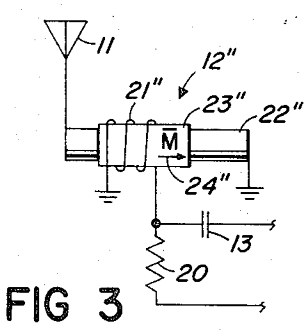
Figure 4:
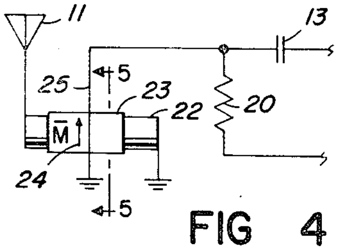
Figure 6:
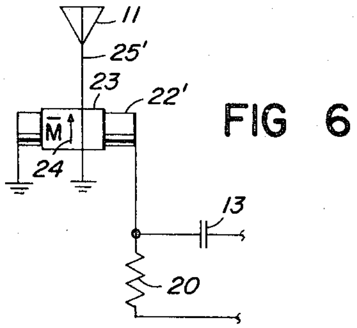
Figure 5:
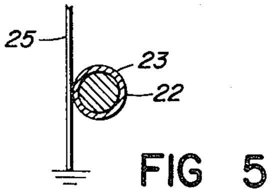

Specific embodiments representing what are presently regarded as the best modes for carrying out the invention are illustrated in the accompanying drawings:

In the drawings:

FIGURE 1 represents a radio receiver equipped with an AGC voltage controlled thin film RF attenuator with the thin magnetic film electroplated circumferentially about a round wire in the presence of an orienting magnetic field resulting in a magnetization vector $\overline{M}$ having a circumferential orientation and with the magnetic flux path closed;

FIGURE 2, a partial schematic utilizing the same type attenuator for a radio receiver as in FIGURE 1 with, however, the wire mounting the circumferential thin film being the signal inductive output in FIGURE 2 instead of the inductive signal input as shown in FIGURE 1, and with the coil about the thin film providing the inductive signal input path as opposed to being the inductive signal sensing output as shown in FIGURE 1;

FIGURE 3, an AGC voltage controlled input signal attenuating system for a receiver such as shown in FIGURE 1, with, however, the magnetization vector being oriented substantially 90° from that of the FIGURE 1 embodiment, and longitudinally in alignment with the axis of the wire mounting the circumferentially deposited thin film;

FIGURE 4, a partial schematic of the AGC attenuating system for a receiver such as shown in FIGURE 1 with, however, a single bypass inductive signal pickup wire replacing the coil wound around the thin film of FIGURE 1;

FIGURE 5 is a partial sectional view taken from line 5 of FIGURE 4 illustrating the wire supporting the thin film, the thin film and the relation of the bypass inductive signal pickup wire of the AGC system; and, FIGURE 6, a partial schematic of inductive coupling relations to and through and with respect to the magnetic vector of a thin magnetic circumferential film as in the embodiment of FIGURE 4, with, however, the input and outputs reversed.

Referring to the drawings:

The RF receiver 10 of FIGURE 1 receives an RF signal from antenna 11. The RF signal received is fed through thin film attenuator 12 and capacitor 13 to RF amplifier 14. The output of RF amplifier 14 is passed to and through an audio detector 15 and on through an audio amplifier 16 to speaker 17. An AGC loop 18 is connected to the output of detector 15, has an AGC voltage signal amplifier 19, and resistor 20, and is connected to the secondary winding 21 of thin film attenuator 12 and through the voltage winding to a voltage potential reference, shown in FIGURE 1 to be ground. The equivalent of a primary winding of thin film attenuator 12 is straight wire 22 shown to be connected to antenna 11 at one end and to the voltage potential reference ground at the other end. The thin film 23 of thin film attenuator 12 is a circumferential deposition of thin magnetic film material deposited on a portion of the wire 22 in the presence of a magnetic field. This field is so oriented that the resulting film acts as a single domain with the rest direction extending circumferentially with the thin film 23 coating on the round wire 22 as indicated by the magnetization vector $\overline{M}$ arrow 24 which, in this instance, is perpendicular to the magnetic field generated with current flow through coil winding 21. Please note that the thin film attenuator 12 is so constructed that wire 22 and winding 21 are substantially mutually perpendicular and are so positioned relative to the thin film 23 deposited on wire 22 as to provide the desired operational orientation with relation to the magnetic vector $\overline{M}$.

During operation, as long as no DC voltage is applied to the secondary winding 21, RF signal input voltages are not coupled from the RF signal input wire 22 through the thin magnetic film, since the magnetic field variations produced by RF signal voltages in the input wire 22 are variations produced in a magnetic field substantially parallel to the rest direction of the magnetic vector $\overline{M}$. Since no AGC control voltage is applied to the second winding 21, the magnetic vector $\overline{M}$ is not displaced from its rest direction and no change in flux linkages are produced which would induce a voltage in the secondary winding. However, the AGC loop 18 is arranged to provide a maximum DC control current at minimum RF signal input voltage, and minimum current at maximum RF signal input levels. Thus, the relatively maximum DC control current, applied to the secondary winding, when there is no RF signal input, rotates the magnetic vector $\overline{M}$ away from its rest direction by an amount proportional to the magnitude of the DC control voltage applied. Then, when RF signals are applied to the input wire 22, the magnetic vector $\overline{M}$ is caused to rotate about its new direction, thereby inducing a corresponding output voltage in the output winding 21 with the output voltage substantially an undistorted image of the RF signal input. Further, the magnitude of the induced voltage in the output winding 21 depends upon the degree of position displacement of the magnetic vector $\overline{M}$ and, in turn, upon the AGC derived control DC voltage applied to the output winding 21. Thus, use of one or more of these variable RF attenuators between various stages of RF or IF amplifier stages, as part of an AGC circuit, will aid in providing wide dynamic range in amplification. With the system as shown in FIGURE 1, the AGC amplifier must supply maximum current to the thin film attenuator at minimum RF signal input, and minimum current at maximum signal input.

There are many other embodiments and variations of embodiments, for example, a thin film attenuator may have a magnetic vector $\overline{M}$ initially not parallel with the axis of the output winding, somewhere 5 to 10 degrees off the axis, with application of an RF signal input causing an increase in the current supplied from the AGC amplifier to rotate the vector $\overline{M}$ in the direction which causes an increase in attenuation. Other embodiments have various orientations of the magnetic vector $\overline{M}$, and application of the AGC controlling voltage to either the RF input wire or winding, as the case may be, or the secondary wire or output winding, as the case may be, as appropriate for the particular embodiments involved, and operate with either a controlling DC voltage increase or decrease, as appropriate, with an increasing RF input signal.

In the embodiment of FIGURE 2, components duplicating those in the embodiment of FIGURE 1 are, for the sake of convenience, numbered the same and those similar carry primed identification numbers. With this particular embodiment, RF signals sensed by the antenna 11 are passed to the coil 21' acting as a primary coil for the attenuator 12'. These RF signals create varying magnetic field forces substantially at right angles to the magnetic $\overline{M}$ vector 24. The secondary of the thin film attenuator 12' in this instance is wire 22' around a portion of which the thin film 23' has been deposited while subjected to such a magnetic field as to give a circumferential direction to the rest direction magnetic vector $\overline{M}$ arrow 24. With such a magnetic vector orientation higher AGC current flow through wire 22' consistent with higher AGC voltages results in a more firm fixation positionally of the magnetic $\overline{M}$ vector 24, if the AGC created magnetic field forces are aiding rather than opposing the vector, and thereby provides increased attenuation of signals transferred through the attenuator 12'. This, obviously, requires an inverse AGC voltage development in operation from the AGC voltage action utilized in the FIGURE 1 embodiment in providing an AGC voltage controlling action responsive to varying RF signal strengths fed to the attenuating device and passed to the receiver system.

Referring now to the embodiment of FIGURE 3, components duplicating those in the embodiment of FIGURE 1 are, for the sake of convenience, numbered the same and those similar carry double primed identification numbers. Here, RF signals sensed by the antenna 11 are passed to the primary of attenuator 12 and through the attenuator and capacitor 13 to the RF amplifier. The input primary of this embodiment is straight wire 22'' in the same manner that wire 22 was the signal input primary of attenuator 12 in the FIGURE 1 embodiment. While the thin film deposition 23'' of the FIGURE 3 embodiment is a circumferential deposition of this magnetic film material on a portion of the wire 22'', similar to the corresponding thin film deposition on wire 22 of FIGURE 1, the thin magnetic film material is deposited in the presence of a magnetic field externally imposed for this particular embodiment. The magnetic field in this instance is so oriented that the resulting film acts as a single domain with the rest direction extending longitudinally substantially parallel with the axis of the straight round wire 22 as indicated by the magnetization vector $\overline{M}$ arrow 24''. In this embodiment, AGC control current passed through secondary coil winding 21'' consistent with increasingly higher AGC voltage results in an increasingly firm fixation positionally of the magnetic $\overline{M}$ vector 24'' and thereby increased attenuation of signals transferred through the attenuator 12''. This is an AGC action similar in many respects to the corresponding action with the FIGURE 2 embodiment with both requiring an inverse AGC voltage development in operation from the AGC voltage action utilized in the FIGURE 1 embodiment for providing an AGC voltage controlling action responsive to varying RF signal strengths fed to the attenuating device and passed to the receiver system.

In the embodiment of FIGURES 4 and 5 two inductive signal linkages are employed, including one as an input linkage to the magnetic thin film 23 with the degree of signal transmission being a factor with respect to the position of the magnetic $\overline{M}$ rest position vector in a thin magnetic film deposited on the wire of one of the wires and the rotated position of the vector as determined by additional field forces. The other linkage is an output inductive signal coupling linkage from and with respect to the magnetic vector $\overline{M}$ to an output wire. In this particular embodiment, the thin magnetic film 23 is circumferentially deposited on a signal input wire 22 connected between antenna 11 and ground, and magnetic $\overline{M}$ vector arrow 24 has a rest direction oriented substantially circumferentially with the thin film in a closed circumferential path about the input wire 22. The output signal wire 25 is connected between ground and the common junction of capacitor 13 and resistor 20 for RF signal transmission to the radio receiver, and for AGC voltage developed feedback shifting of the rest position of magnetic vector $\overline{M}$ as determined by AGC current flow through the wire 25. This determines the degree of signal transmission and provides signal attenuation automatic control through the thin film device, the same AGC type action as employed with the embodiment of FIGURE 1.

The thin magnetic film attenuator embodiment of FIGURE 6 is much the same as the embodiment of FIGURES 4 and 5 with, however, the input wire and output wires reversed and the thin magnetic film deposited on the output wire rather than on the input wire in this particular embodiment. Here, however, an inverse AGC voltage development in operation from the AGC voltage action utilized in the FIGURES 1 and 4 embodiments is required for providing the desired AGC voltage controlling action responsive to varying RF signal strengths fed to the attenuating device and passed to the receiver system. This inverse AGC voltage development action for appropriate operation is similar to the AGC voltage development action of the FIGURES 2 and 3 embodiments.

Thus, there are hereinabove provided various thin film attenuator embodiments for use with amplifier AGC loops wherein the application of increasing RF signal input voltages to the amplifier causes such a change in control voltage or current development from an AGC loop amplifier that the magnetic vector $\overline{M}$ of a thin film attenuator is progressively rotated to positions giving more RF signal attenuation. The various embodiments advantageously include a thin magnetic film deposited upon a wire comprising one of the inductive signal transmitting links with the thin magnetic film itself. Further, for those embodiments utilizing a substantially circumferentially directed magnetic vector rest direction, the magnetic vector is quite easily and readily established by the passing of a DC current through the wire upon which the thin film is deposited during the deposition process. This results quite advantageously in a circumferentially oriented magnetic vector rest direction having a closed circumferential path. It should be noted that generally where the AGC created magnetic field forces are substantially parallel to the rest direction of the vector, the connections of the attenuator should be so arranged that the AGC current flow be such as to create magnetic field forces aiding rather than opposing the magnetic vector $\overline{M}$. Further, other wire shapes may be used, in place of a round wire, upon which a continuous surrounding magnetic thin film band may be deposited in such attenuating devices.

Whereas this invention is here illustrated and described with respect to several embodiments thereof, it should be realized that various changes may be made without departing from the essential contributions to the art made by the teachings hereof.

I claim:

1. An RF amplifier automatic gain control (AGC) system using a thin film ferromagnetic attenuator for attenuation of RF input signals to the amplifier, for operation over a wide dynamic range, including: said thin film ferromagnetic attenuator with a ferromagnetic substantially single domain thin film deposited as a closed circuitous band on a wire in the presence of a magnetic field for obtaining a magnetization vector having a predetermined rest direction, and having two signal inductive means associated with the thin film including said wire upon which said thin film is deposited and a second signal inductive wire with the wires being generally in substantially mutually perpendicular planes and in relatively close contiguous relation, and with the rest direction of the single domain magnetic vector being within a relatively small angle from being parallel to the axis of one of said signal inductive means; RF signal input means connected to one of said signal inductive means as a signal input primary to the attenuator; means coupling the other signal inductive means, as a signal output secondary device, to an RF amplifier; a detector connected for receiving the output of said RF amplifier and having output means; and an AGC loop connected to said output means for developing AGC direct current control voltage and applying the control voltage to a signal inductive device operatively associated with said thin film attenuator.

2. The AGC system of claim 1, wherein said AGC loop is connected for applying AGC direct current through a wire of one of said two signal inductive means.

3. The AGC system of claim 1, wherein the portion of wire upon which the closed circuitous band of ferromagnetic thin film is deposited is a straight substantially round portion of wire.

4. The AGC system of claim 3, wherein the other wire than the wire upon which the ferromagnetic thin film is deposited is wound in coil winding form about the ferromagnetic thin film positioned on a wire.

5. The AGC system of claim 1, wherein the single domain magnetic vector is substantially common to a plane normal to the wire upon which the ferromagnetic thin film is deposited.

6. The AGC system of claim 1, wherein the single domain magnetic vector is substantially parallel to the axis of the wire upon which the ferromagnetic thin film is deposited.

7. The AGC system of claim 1, wherein the two wires are substantially straight wires at substantially right angles to each other passing in close adjacency to each other, and with the ferromagnetic thin film deposited on one of the wires being located in the close adjacency region of the two wires.

References Cited

UNITED STATES PATENTS

| | | | |
|---|---|---|---|
| 3,259,846 | 7/1966 | Elliott et al. | 325—415 |
| 3,317,863 | 5/1967 | Ngo | 333—24.2 X |
| 3,320,554 | 5/1967 | Wieder | 333—24.2 X |

ROY LAKE, *Primary Examiner.*

JAMES B. MULLINS, *Assistant Examiner.*